United States Patent
Courtel

(10) Patent No.: US 9,059,641 B2
(45) Date of Patent: Jun. 16, 2015

(54) MAIN SUPPLY ZERO CROSSING DETECTION FOR PFC CONVERTER

(75) Inventor: Karl Jean-Paul Courtel, Reze (FR)

(73) Assignee: Atmel Corporation, San Jose, CA (US)

(*) Notice: Subject to any disclaimer, the term of this patent is extended or adjusted under 35 U.S.C. 154(b) by 159 days.

(21) Appl. No.: 13/176,569

(22) Filed: Jul. 5, 2011

(65) Prior Publication Data

US 2013/0010508 A1 Jan. 10, 2013

(51) Int. Cl.
*G05F 1/00* (2006.01)
*H02M 1/42* (2007.01)
*G01R 19/175* (2006.01)

(52) U.S. Cl.
CPC .......... *H02M 1/4225* (2013.01); *G01R 19/175* (2013.01); *Y02B 70/126* (2013.01)

(58) Field of Classification Search
CPC .................................... H02M 1/4225
USPC ......... 323/282, 283, 284, 285, 222, 290, 362, 323/363, 205, 207, 299, 351, 271, 237, 225, 323/267, 288; 363/9, 76, 81, 84, 89, 16, 17, 363/39
See application file for complete search history.

(56) References Cited

U.S. PATENT DOCUMENTS

| | | | |
|---|---|---|---|
| 6,300,723 B1* | 10/2001 | Wang et al. | 315/247 |
| 7,622,820 B1* | 11/2009 | Prodic et al. | 307/31 |
| 7,733,678 B1* | 6/2010 | Notohamiprodjo et al. | 363/89 |
| 2005/0168203 A1* | 8/2005 | Dwarakanath et al. | 323/282 |
| 2006/0245219 A1* | 11/2006 | Li | 363/89 |
| 2009/0141524 A1* | 6/2009 | Fagnani et al. | 363/89 |
| 2009/0189579 A1* | 7/2009 | Melanson et al. | 323/282 |
| 2012/0019225 A1* | 1/2012 | Tsai | 323/284 |

* cited by examiner

*Primary Examiner* — Matthew Nguyen
*Assistant Examiner* — Trinh Dang
(74) *Attorney, Agent, or Firm* — Fish & Richardson P.C.

(57) ABSTRACT

A fault mode of a PWM module embedded in a microcontroller is used to detect main supply zero crossings for regulating output voltage of a PFC converter operating in BCM, without using an external detecting element or a comparator, ADC or other specialized component internal to the microcontroller. In some implementations, the end of decrease current flow in the energy storage inductor of the converter is used to reinitialize a PWM timer or counter (counting-up or counting-down timer). The current goes to zero for a time period when the main supply voltage goes to zero, resulting in the PWM timer or counter not being reinitialized prior to the end of the current PWM cycle. The failure to reinitialize the timer or counter can be used to generate a signal indicative of a zero voltage crossing of the main supply voltage.

19 Claims, 6 Drawing Sheets

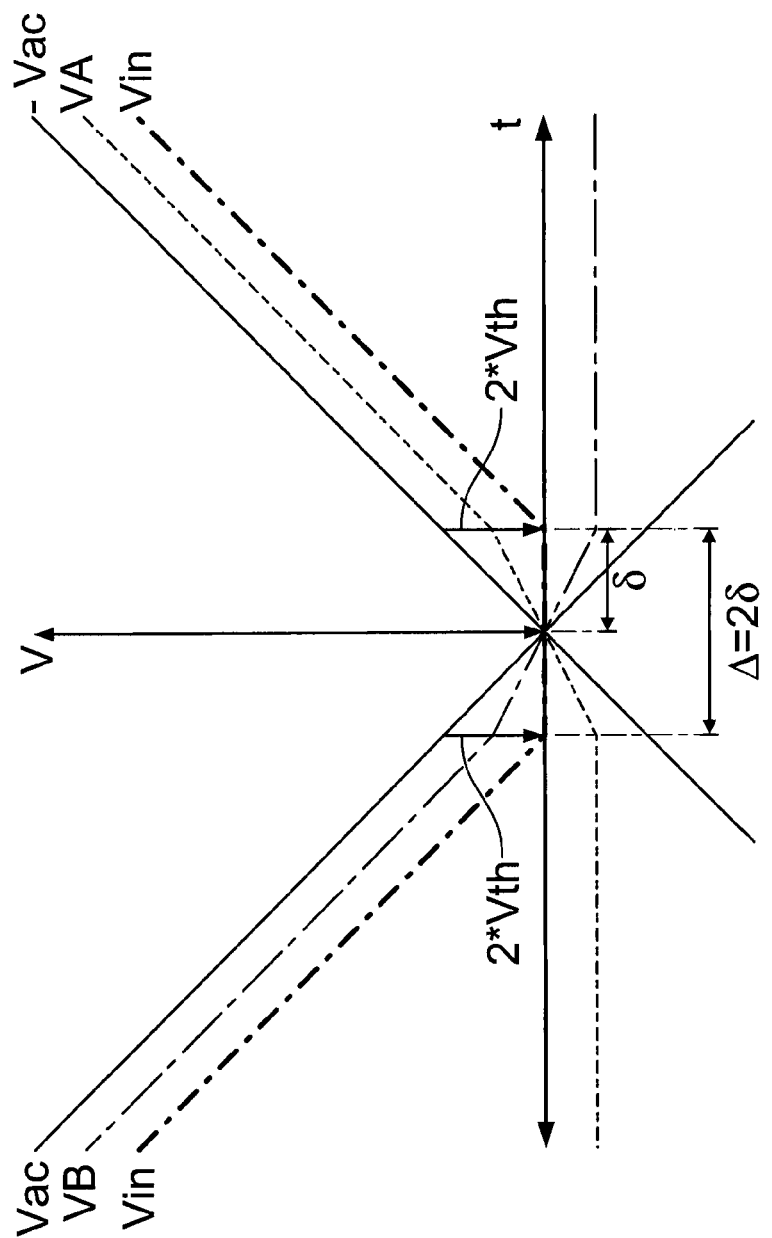
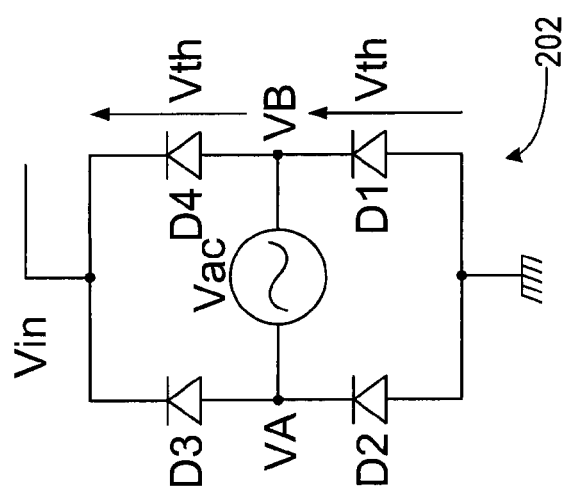
FIG. 5
FIG. 4

MAIN SUPPLY ZERO CROSSING DETECTION FOR PFC CONVERTER

TECHNICAL FIELD

This disclosure relates generally to electronics, and more particularly to Power-Factor-Correction (PFC) in switching mode power supplies.

BACKGROUND

FIG. 1 is a plot illustrating waveforms associated with operation of a PFC boost converter operating in Borderline Conduction Mode (BCM). An example PFC boost converter circuit is shown in FIG. 2.

The plot shows waveforms for output voltage $V_{out}$, input voltage $V_{in}$ and inductor current $I_l$. When using a microcontroller to control PFC in a boost converter operating in BCM, the boost switch conduction time ($T_{on}$) is maintained constant over each half cycle of the input sinusoidal voltage. The peak inductor current $I_l$ for each switching cycle is proportional to the input voltage $V_{in}$ which is nearly constant during $T_{on}$ ($I_l$ peak=$V_{in} \times T_{on}/L$). Since the average value of the triangular $I_l$ waveform is half its peak value, the average current drawn is also proportional to the input voltage $V_{in}$. This implies that $V_{out}$ is composed of a continuous voltage plus a rectified sinusoidal component of the same frequency as the rectified input voltage $V_{in}$. Because of the rectified sinusoidal component of $V_{out}$, to stabilize the $V_{out}$ regulation loop of the converter, measurement of $V_{out}$ must be done each cycle at the same position of the main supply period. This can be accomplished by detecting a reference point of the input voltage period. Generally, the $V_{in}$ zero crossing point is taken as the most obvious reference point of the main supply period.

FIG. 2 is a conventional PFC boost converter 200 controlled by a microcontroller 204. FIG. 3 illustrates waveforms associated with the operation of converter 200. Converter 200 can include rectifier 202 (D1-D4), microcontroller 204, energy storage inductor 206 (L), boost switch 216 (e.g., MOSFET), divider circuits 218 (R1, R2), 220 (R3, R4), 224 (R5, R6), capacitor 222 (C) and diode 226 (D5). Microcontroller 204 can include comparator 208, PWM module 210, central processing unit (CPU) 221 and ADC 214.

In the configuration shown, full-bridge rectifier 202 (a diode bridge) rectifies voltage, $V_{ac}$, to provide rectified input voltage $V_{in}$. In an "on" state, switch 216 is closed by PWM module 210 for switch conduction time $T_{on}$, resulting in an increase of $I_l$ in energy storage device 206 (e.g., an inductor) due to $V_{in}$. In an "off" state, switch 216 is opened by PWM module 210 and the only path offered to $I_l$ is through diode 226, capacitor 222 and the load. This results in transferring energy accumulated in inductor 206 during the on state into capacitor 222. FIG. 3 illustrates the triangular waveform for current $I_l$ that is generated by the on state and off state of switch 216, which is commanded by PWM module 210

Current in a secondary coil coupled to energy storage inductor 206 is taken from current divider 220 and supplied to high and reverse voltage protected input IZCD to PWM module 210, where it is used to detect the end of $I_l$ decrease time to initiate a new PWM cycle. $V_{out}$ is an analog value taken from voltage divider 224 and supplied as feedback (FB) to the voltage regulation loop of converter 200. At each zero crossing of $V_{in}$, ADC 214 converts FB into a digital value, which is provided as input to CPU 212. CPU 212 computes via a proportional-integral-derivative (PID) algorithm an updated compare value (cmp) to PWM module 210 based on FB. PWM module 210 updates $T_{on}$ based on cmp to adjust $V_{out}$.

In some implementations, an external specialized component (e.g., an optocoupler external to microcontroller 204) can be used to detect the zero crossing point of $V_{in}$. In converter 200, $V_{in}$ is taken from voltage divider 218 and supplied as input VZCD into microcontroller 204. The VZCD input to microcontroller 204 is configured as an input of internal comparator 208, or an input channel of internal ADC 214. FIG. 3 shows that VZCD is about zero at the zero crossing point of $V_{in}$, causing the output of comparator 208 to provide a command to ADC 214 to sample $V_{out}$.

Using comparator 208 or ADC 214 in free running mode (continuous conversion) in microcontroller 204 for detecting main supply zero crossings is costly to implement and can limit the application field that microcontroller 204 can cover. For example, if microcontroller 204 is used to drive an electrical motor with its power supply, the bandwidth of ADC 214 needed for $V_{in}$ zero crossing detection can make the motor control unfeasible or limited, and the use of a comparator for $V_{in}$ zero crossing detection can make the motor control costly because of the use of an additional external comparator due to a lack of internal comparator resources.

SUMMARY

A fault mode of a PWM module embedded in a microcontroller is used to detect main supply zero crossings for regulating output voltage of a PFC converter operating in BCM, without using an external detecting element or a comparator, ADC or other specialized component internal to the microcontroller. In some implementations, an external event (external to the microcontroller) is used to reinitialize the PWM timer or counter. For example, when the current in an energy storage inductor of the converter goes to zero, using the property that for a time period when the main supply voltage goes to zero, this external event does not occur, making the PWM counting-down timer not reinitialize prior to the end of the current PWM cycle. Failure to reinitialize the timer causes the timer to reach its bottom value before the end of the current PWM cycle. Failure to reinitialize the timer (e.g., a counting-down timer) causes the timer to reach its bottom value (counter=0) before the end of the current PWM cycle.

Accordingly, the failure to reinitialize the timer of the PWM module is used to detect indirectly zero voltage crossing points of the main voltage supply. Upon each zero crossing detection, when no external event occurs to reinitialize the timer, the timer reaches its bottom value generating an eoc signal provided as a trigger to an ADC in the microcontroller to sample the output voltage of the converter for use in regulating the output voltage. In some implementations, the base of a counting-up or counting-down timer (as time base of a PWM timer) can be used to detect zero crossings. For example, in this case of a counting-up timer, the detection of the timer top value (counter=period) can be used to detect the main supply zero crossing point.

Particular implementations of the disclosed PWM architecture for a PFC converter provide one or more of the following advantages. The PWM architecture eliminates the need for an external component (e.g., optocoupler), or an internal comparator or an ADC in free running mode to detect the zero crossing points of the main voltage supply. The crossing points detection can be used to generate a signal to the ADC of the microcontroller that causes the ADC to sample the output voltage, which can be used as feedback into an output voltage regulation loop of the converter.

The details of one or more disclosed implementations are set forth in the accompanying drawings and the description

BRIEF DESCRIPTION OF THE DRAWINGS

FIGS. 4-5 illustrate derivation of a time window when no current flows in the energy storage inductor shown in FIG. 2.

DETAILED DESCRIPTION

Zero Crossing Detection Using PWM Fault Mode

Figure 1:
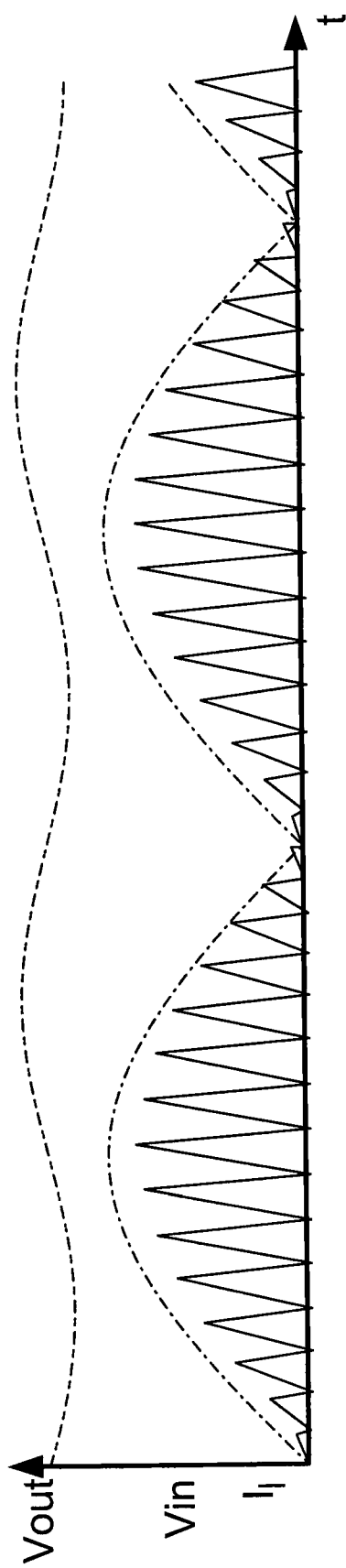
FIG. 1 is a plot illustrating waveforms associated with operation of a PFC boost converter operating in BCM.
Figure 2:
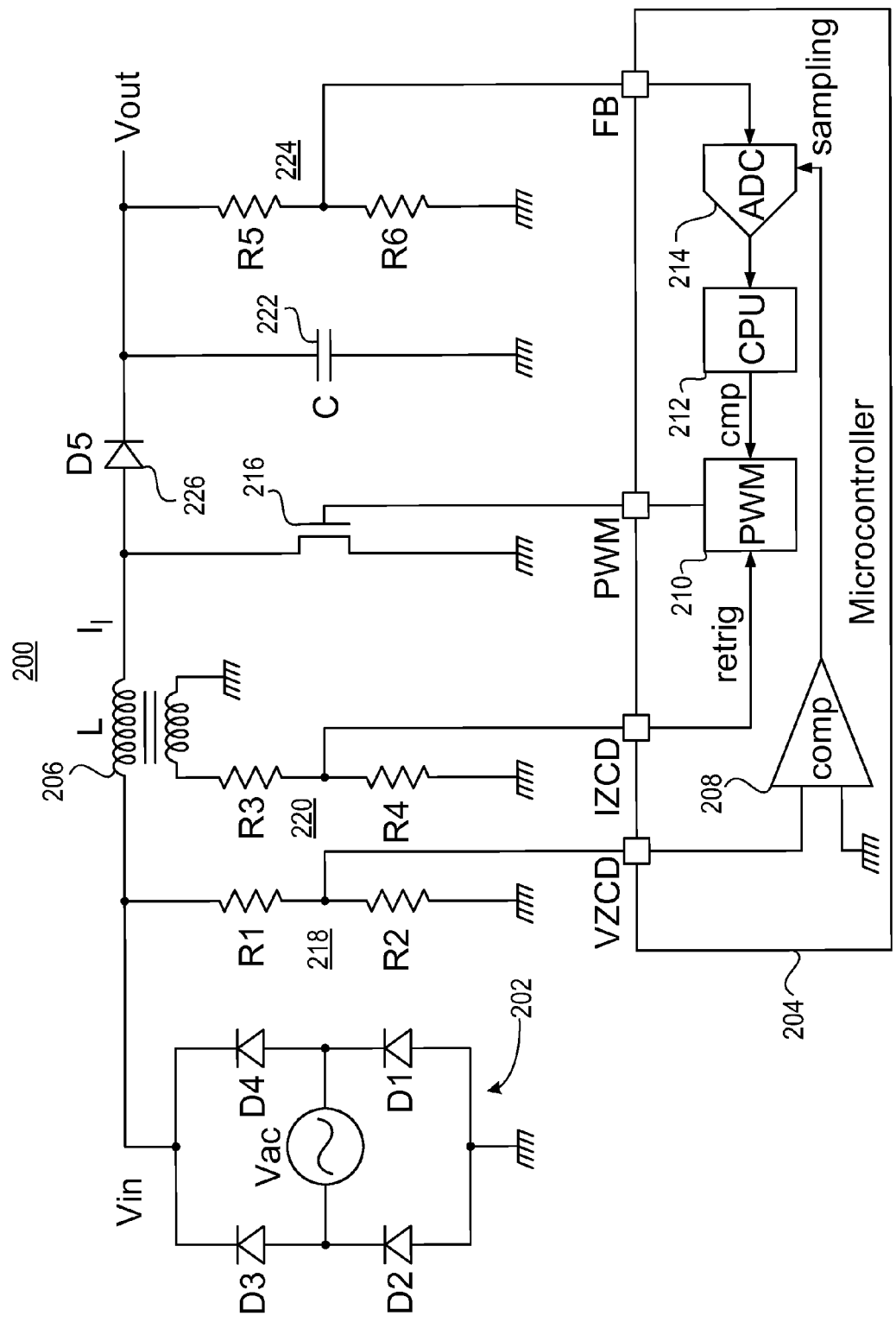
FIG. 2 is schematic diagram of a conventional PFC boost converter, including a microcontroller with an embedded PWM architecture for regulating output voltage.
Figure 3:
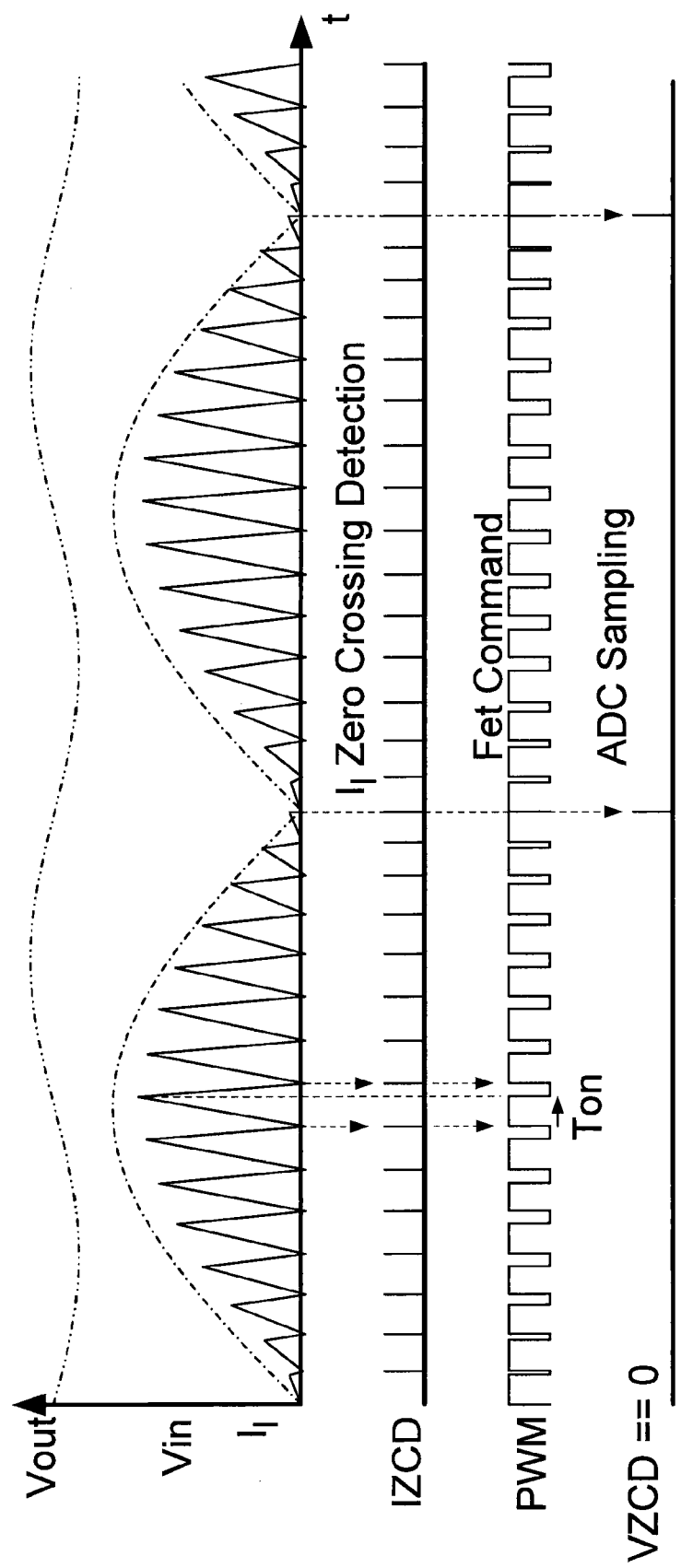
FIG. 3 illustrates waveforms associated with operation of the PFC boost converter shown in FIG. 2.

FIGS. 4-5 illustrate a derivation of a time window in a PWM cycle when no current flows in the energy storage inductor 206 shown in FIG. 2. The inventor has observed that the main supply voltage $V_{ac}$ cannot deliver current into inductor 206 if $V_{ac} < 2V_{th}$, as illustrated in FIG. 4. Each diode in diode bridge 202 has a threshold voltage $V_{th}$. Since diodes (D1, D3) or (D2, D4) are coupled in series, $V_{in}$ will be zero until $V_{ac}$ is greater than $2V_{th}$. As shown in FIG. 5, next to $V_{ac}$'s zero crossing voltage, no current is delivered to inductor 206. Since no current flows through inductor 206, no end of inductor current decrease time can be detected. This property can be used to make an indirect detection of $V_{ac}$ zero crossing points.

In a PFC boost converter operating in BCM, IZCD can be used to reinitialize a time base or counter of a timer 228 in PWM module 210 to start a new PWM cycle. In normal operation, an IZCD trigger event reinitializes the timer's base time base before the timer reaches its bottom value (case of counting-down timer) at the end of the current PWM cycle. However, during a time window Δ around the $V_{in}$ zero crossing point, the IZCD event does not occur since current does not flow though inductor 206 during the time window Δ, which is given by $$\Delta = \frac{T}{\pi} * \frac{(2 * v_{th})}{v_{max}}$$

where $V_{max}$ is the maximum voltage of the main supply voltage, $V_{ac}$, $V_{th}$ is the threshold voltages of the diodes in diode bridge 202, and T is the period of the main supply voltage $V_{ac}$.

Figure 6:
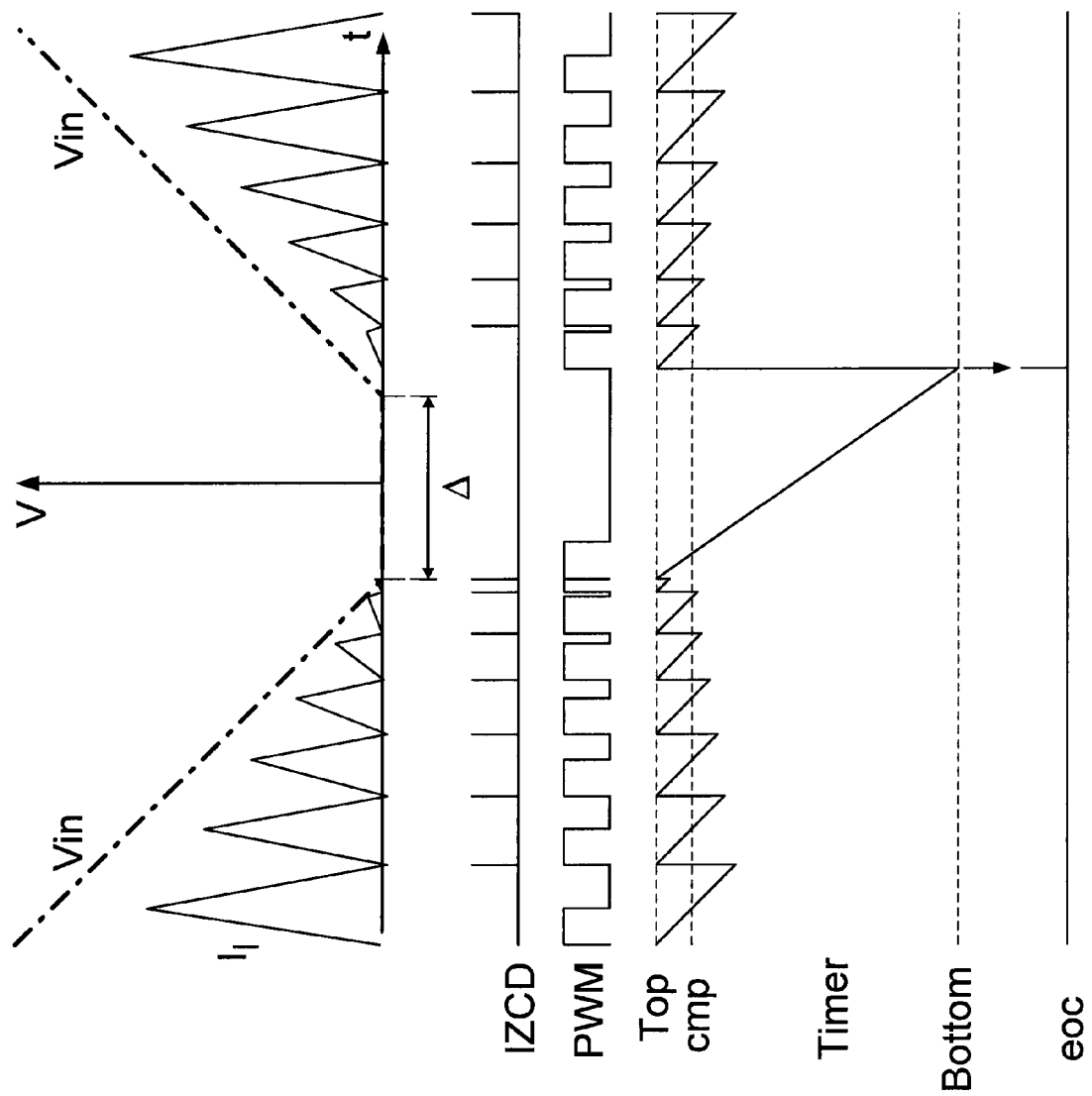
FIG. 6 illustrates waveforms associated with operation of a boost converter using indirect detection of zero voltage crossings of the main voltage supply in the case of a counting-down timer.

FIG. 6 illustrates waveforms associated with operation of a PFC boost converter using indirect detection of zero voltage crossings of the main voltage supply. The absence of the IZCD event trigger during the time window Δ, results in a counting-down timer reaching its bottom value because the base time is not reinitialized before the end of the programmed PWM cycle period, as shown in FIG. 6. The $V_{in}$ crossing point is detected via the underflow detection of the timer (timer=bottom=0) causing the eoc (End of Cycle) signal to be generated by PWM module 210. The signal eoc is provided as trigger input to ADC 214, causing ADC 214 to sample the output voltage of the converter 200. This indirect detection of zero voltage crossing can replace the conventional VZCD-enabled zero voltage crossing detection by comparator 208 or ADC 214, or external optocoupler as described in reference to FIG. 2. In some implementations, the process described above can be implemented on the base of a counting-up timer.

In some implementations, PWM module 210 using time-proportioning control can increment periodically a timer that is reset at the end of every programmed period of the PWM. When the timer value is more than a reference value cmp, the PWM output changes state from high to low (or low to high), so a proportion of a fixed cycle time is spent in a logical state; the complementary cycle is spent in the opposite logical state. In the case of time-proportional control, the detection of the timer reaching the PWM programmed period value can be used to detect the main supply zero crossing point.

To detect the Vin crossing point using a counting-down timer, the constraint $$\frac{(top - cmp)}{F_{timer}} < \Delta$$

applies, where $F_{timer}$ is timer frequency and cmp is a compare value provided by CPU 212 to PWM module 210 to adjust $T_{on}$.

To detect the Vin crossing point using a counting-up timer, the constraint $$\frac{cmp}{F_{timer}} < \Delta$$

applies.

Figure 7:
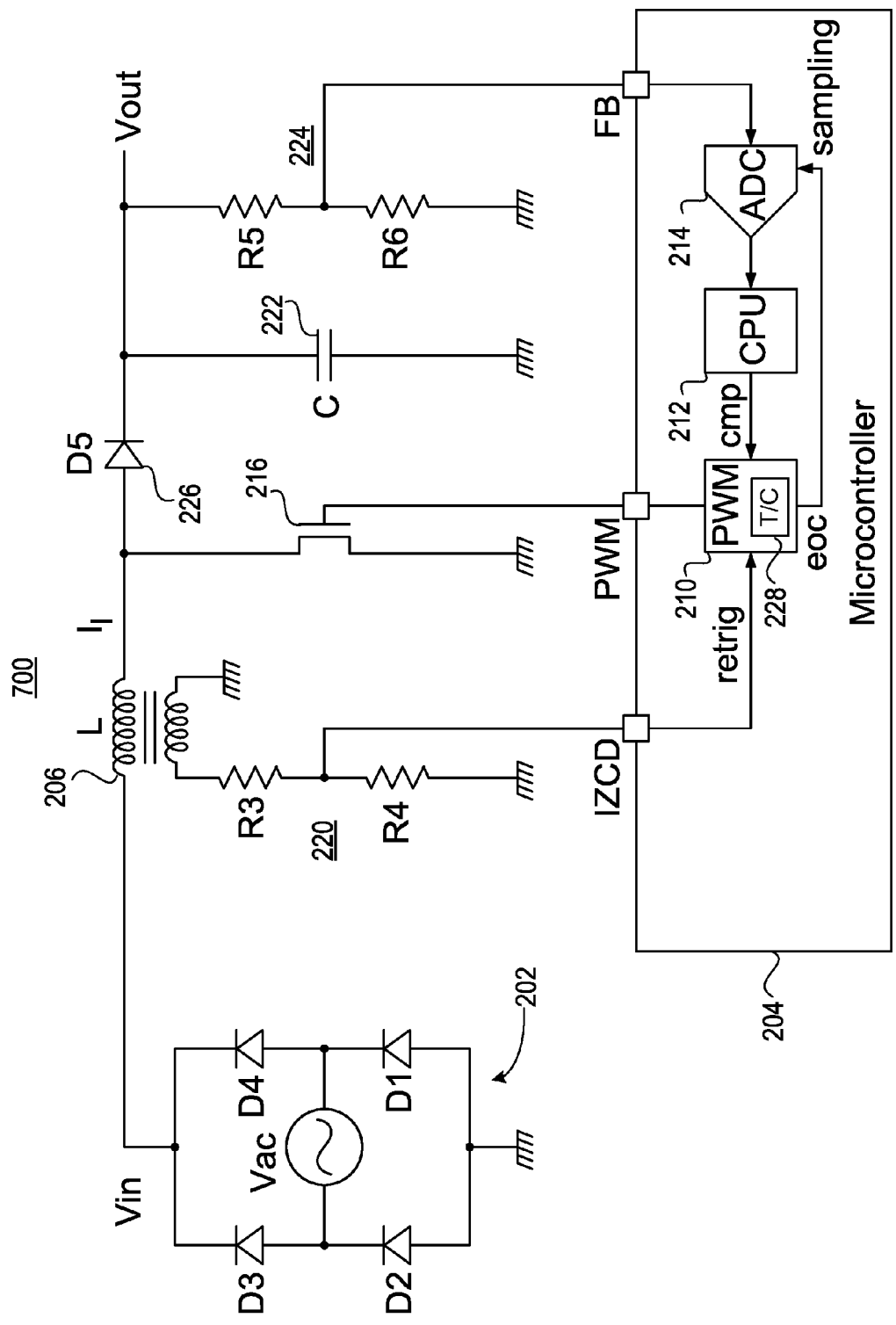
FIG. 7 is a schematic diagram of a PFC boost converter, using a PWM fault mode to detect zero voltage crossings of the main supply voltage.

FIG. 7 is a schematic diagram of a boost converter 700, using a PWM module fault mode to detect main supply voltage zero crossings. Converter 700 includes the same components as converter 200 shown in FIG. 2, except that comparator 208 has been removed, and PWM module 210 generates an eoc signal when the timer (counting up or down) reaches its programmed cycle value (respectively, top or bottom value) because of the absence of an IZCD trigger event.

During the time window Δ, current does not flow in inductor 206. This results in IZCD not being available to reinitialize the (counting-up or counting-down) timer based in PWM module 210, resulting in the timer reaching its programmed cycle value (respectively, top or bottom value), as shown in FIG. 5. This occurs when the timer overflows or underflows. PWM module 210 detects this overflow or underflow event generating the eoc signal, which is provided as a trigger capture event to ADC 214. The eoc signal causes ADC 214 to sample the output voltage. The sampled output voltage is provided as feedback into the voltage regulation loop (PID algorithm) of CPU 221.

Table I below includes application examples for various combinations of $V_{ac}$, $V_{ac}$ frequencies, Δ time windows, and $F_{timer}$. The values in Table I assume $V_t = 1V$.

| V$_{ac}$ Voltage | V$_{ac}$ Freq | Δ | Timer Freq | Max cmp-top (counting-down timer) Max cmp value (counting-up timer) |
|---|---|---|---|---|
| 110 V | 60 HZ | 96 μs | 12 Mhz | 1158 |
| 110 V | 60 HZ | 96 μs | 32 Mhz | 3088 |
| 220 V | 50 HZ | 57 μs | 12 Mhz | 694 |
| 220 V | 50 HZ | 57 μs | 32 Mhz | 1852 |

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A power-factor-correction (PFC) converter circuit, comprising:
   a rectifier circuit;
   an energy storage device coupled to the rectifier circuit and configured to receive an input voltage from the rectifier circuit;
   a switch coupled to the energy storage device, the switch configurable to provide a path for removing energy from the energy storage device;
   a microcontroller coupled to the energy storage device and the switch; and
   an analog-to-digital converter (ADC) coupled to an output of the power-factor-correction (PFC) converter circuit and to the microcontroller, where the microcontroller includes a pulse width modulation (PWM) module coupled to the energy storage device, the PWM module being configured to enable the ADC to sample an output voltage of the power-factor-correction (PFC) converter circuit by detecting a zero voltage crossing point of the input voltage received from the rectifier circuit based on an absence of a trigger event that occurs external to the microcontroller, the absence of the trigger event being based on an end of decrease current flow in the energy storage device.

2. The circuit of claim 1, where the PWM module indirectly detects the zero voltage crossing point of the input voltage by detecting when a timer or counter for controlling the PWM module in the power-factor-correction (PFC) converter circuit is not reinitialized by the trigger event prior to an end of a programmed PWM cycle period of the PWM module, and
   where the timer or counter is reinitialized by the trigger event before the end of the programming PWM cycle period to start a new programming PWM cycle when the input voltage is not at the zero voltage crossing point.

3. The circuit of claim 1, where the rectifier circuit is a diode bridge.

4. The circuit of claim 1, where the sampled output voltage is used in a voltage regulation loop of the power-factor-correction (PFC) converter circuit.

5. The circuit of claim 1, where the energy storage device includes first and second inductors, and where the first inductor is coupled to the rectifier circuit and the second inductor is magnetically coupled to the first inductor and connected to the PWM module for generating the trigger event.

6. The circuit of claim 1, where the PWM module is configured to perform operations comprising:
   in response to detecting that the input voltage has reached the zero voltage crossing point, generating a trigger signal; and
   providing the trigger signal to the ADC, the trigger signal causing the ADC to sample the output voltage of the converter circuit.

7. The circuit of claim 2, where the PWM module includes a retriggerable counting-down timer and the zero voltage crossing point is detected when the retriggerable counting-down timer reaches its bottom value.

8. The circuit of claim 2, where the PWM module includes a retriggerable counting-up timer and the zero voltage crossing point is detected when the retriggerable counting-up timer reaches its top value.

9. The circuit of claim 2, where the energy storage device includes an inductor and the external trigger event is based on the end of decrease current flow in the inductor.

10. The circuit of claim 9, where the inductor does not receive any current during a time window Δ given by $$\Delta = \frac{T}{\pi} * \frac{(2 * v_{th})}{v_{max}}$$

where V$_{max}$ is the maximum voltage of a main supply voltage, V$_{ac}$, V$_{th}$ is the threshold voltages of diodes in a diode bridge, and T is the period of the main supply voltage V$_{ac}$.

11. The circuit of claim 10, where the PWM module includes a retriggerable counting-down timer, and the retriggerable counting-down timer uses a compare value cmp that is used to adjust conduction time of the switch and complies with a constraint $$\frac{(top - cmp)}{F_{timer}} < \Delta$$

where top is the top value of the retriggerable counting-down timer and F$_{timer}$ is timer frequency.

12. The circuit of claim 10, where the PWM module includes a retriggerable counting-up timer, and the retriggerable counting-up timer uses a compare value cmp that is used to adjust conduction time of the switch and complies with a constraint $$\frac{cmp}{F_{timer}} < \Delta,$$

where F$_{timer}$ is timer frequency.

13. The circuit of claim 10, where the external trigger event that did not occur during the time window Δ failed to reinitialize the timer or counter.

14. A method performed by a power-factor-correction (PFC) converter circuit, the method comprising:
   receiving an input voltage generated by a supply voltage;
   storing energy in an energy storage device of the power-factor-correction (PFC) converter circuit generated by the input voltage;

configuring a switch of the power-factor-correction (PFC) converter circuit coupled to the energy storage device, where the switch is configured by an output of a pulse width modulation (PWM) module of the power-factor-correction (PFC) converter circuit;

determining that the input voltage has reached a zero voltage crossing point based on a fault mode of the PWM module, where the fault mode of the PWM module is based on an absence of a trigger event, and the absence of the trigger event is based on an end of decrease current flow in the energy storage device, and where the fault mode includes determining that a timer or counter of the PWM module has not been reinitialized by the trigger event prior to an end of a current PWM cycle of the PWM module, and where the timer or counter is reinitialized by the trigger event before the end of the current PWM cycle to start a new current PWM cycle when the input voltage is not at the zero voltage crossing point; and in response to determining that the input voltage has reached the zero voltage crossing point, enabling, by the PWM module, an analog-to-digital converter (ADC) of the power-factor-correction (PFC) converter circuit to sample an output voltage of the power-factor-correction (PFC) converter circuit.

15. The method of claim 14, where enabling, by the PWM module, an analog-to-digital converter (ADC) of the power-factor-correction (PFC) converter circuit to sample an output voltage of the power-factor-correction (PFC) converter circuit includes:

providing a trigger command to the analog-digital converter (ADC) during the current PWM cycle; and causing the ADC to sample the output voltage of the power-factor-correction (PFC) converter circuit, where the sampled output voltage is used in a voltage regulation loop of the power-factor-correction (PFC) converter circuit.

16. The method of claim 14, where the PWM module includes a retriggerable counting-down timer and the zero voltage crossing point is detected when the retriggerable counting-down timer reaches its bottom value.

17. The method of claim 14, where the PWM module includes a retriggerable counting-up timer and the zero voltage crossing point is detected when the retriggerable counting-up timer reaches its top value.

18. The method of claim 14, where the energy storage device includes first and second inductors, and where the first inductor receives the input voltage and the second inductor is magnetically coupled to the first inductor and connected to the PWM module for generating the trigger event.

19. The method of claim 14, where enabling, by the PWM module, an analog-to-digital converter (ADC) of the power-factor-correction (PFC) converter circuit to sample an output voltage of the power-factor-correction (PFC) converter circuit comprises:

in response to determining that the input voltage has reached the zero voltage crossing point, generating a trigger signal; and providing the trigger signal to the ADC, the trigger signal causing the ADC to sample the output voltage of the power-factor-correction (PFC) converter circuit.

\* \* \* \* \*

UNITED STATES PATENT AND TRADEMARK OFFICE
CERTIFICATE OF CORRECTION

PATENT NO.        : 9,059,641 B2
APPLICATION NO.   : 13/176569
DATED             : June 16, 2015
INVENTOR(S)       : Karl Jean-Paul Courtel Page 1 of 1

It is certified that error appears in the above-identified patent and that said Letters Patent is hereby corrected as shown below:

In The Specification

Column 4 Line 21 delete "Vin" and insert --$V_{in}$--, therefor.

Column 4 Line 34 delete "Vin" and insert --$V_{in}$--, therefor.

In The Claims

Column 7 Line 31 In claim 15, delete "analog-digital" and insert --analog-to-digital--, therefor.

Signed and Sealed this
Seventeenth Day of November, 2015

Michelle K. Lee
*Director of the United States Patent and Trademark Office*